(12) United States Patent
Shiomi

(10) Patent No.: US 6,818,983 B2
(45) Date of Patent: Nov. 16, 2004

(54) SEMICONDUCTOR MEMORY CHIP AND SEMICONDUCTOR MEMORY DEVICE USING THE SAME

(75) Inventor: Toru Shiomi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 238 days.

(21) Appl. No.: 10/176,679

(22) Filed: Jun. 24, 2002

(65) Prior Publication Data

US 2003/0042623 A1 Mar. 6, 2003

(30) Foreign Application Priority Data

Aug. 3, 2001 (JP) ..................................... P2001-236421

(51) Int. Cl.[7] .............................................. H01L 23/34
(52) U.S. Cl. ........................ 257/723; 257/724; 257/780
(58) Field of Search ................................ 257/723–724, 257/780

(56) References Cited

U.S. PATENT DOCUMENTS 5,570,274 A    10/1996  Saito et al.
6,617,196 B2 *  9/2003  Iwaya et al. ................. 438/107

FOREIGN PATENT DOCUMENTS

| JP | 7-131129 | 5/1995 |
| JP | 7-153903 | 6/1995 |
| JP | 11-150468 | 6/1999 |

* cited by examiner

Primary Examiner—Luan Thai
(74) Attorney, Agent, or Firm—McDermott Will & Emery LLP

(57) ABSTRACT

To provide a semiconductor memory device that can be mounted on both sides of a circuit board having a relatively simple wiring pattern and can be manufactured at a low cost, the semiconductor memory chip of the present invention includes a plurality of memory cells, a control circuit formed on a semiconductor substrate, a plurality of electrode pads are formed on one of the principal planes for the purpose of input and output of signals to/from the control circuit, wherein at least a pair of the electrode pads consist of selective connection electrode pads that can drive the control circuit by selecting and connecting either one thereof, and the two selective connection electrode pads are disposed on both sides of a longitudinal or lateral chip centerline on the one principal plane.

5 Claims, 6 Drawing Sheets

Fig. 4

| | 1 | 2 | 3 | 4 | 5 | 6 | 7 | 8 | 9 | 10 | 11 |
|---|---|---|---|---|---|---|---|---|---|---|---|
| A | DQg | DQg | A6 | E2 | A7 | ADV | A8 | E3 | A9 | DQb | DQb |
| B | DQg | DQg | BWc# | BWg# | NC | W# | A17 | BWb# | BWf# | DQb | DQb |
| C | DQg | DQg | BWh# | BWd# | NC | E1# | NC | BWe# | BWa# | DQb | DQb |
| D | DQg | DQg | VSS | NC | NC | MCL | NC | NC | VSS | DQb | DQb |
| E | DQPg | DQPc | VDDQ | VDDQ | VDD | VDD | VDD | VDDQ | VDDQ | DQPf | DQPb |
| F | DQc | DQc | VSS | VSS | VSS | ZQ | VSS | VSS | VSS | DQf | DQf |
| G | DQc | DQc | VDDQ | VDDQ | VDD | EP2 | VDD | VDDQ | VDDQ | DQf | DQf |
| H | DQc | DQc | VSS | VSS | VSS | EP3 | VSS | VSS | VSS | DQf | DQf |
| J | DQc | DQc | VDDQ | VDDQ | VDD | MCH | VDD | VDDQ | VDDQ | DQf | DQf |
| K | CQ2 | CQ2# | CLK | NC | VSS | MCL | VSS | NC | NC | CQ1# | CQ1 |
| L | DQh | DQh | VDDQ | VDDQ | VDD | MCH | VDD | VDDQ | VDDQ | DQa | DQa |
| M | DQh | DQh | VSS | VSS | VSS | MCL | VSS | VSS | VSS | DQa | DQa |
| N | DQh | DQh | VDDQ | VDDQ | VDD | MCH | VDD | VDDQ | VDDQ | DQa | DQa |
| P | DQh | DQh | VSS | VSS | VSS | MCL | VSS | VSS | VSS | DQa | DQa |
| R | DQPd | DQPh | VDDQ | VDDQ | VDD | VDD | VDD | VDDQ | VDDQ | DQPa | DQPe |
| T | DQd | DQd | VSS | NC | NC | LBO# | NC | NC | VSS | DQe | DQe |
| U | DQd | DQd | NC | A3 | NC | A15 | NC | A11 | NC | DQe | DQe |
| V | DQd | DQd | A5 | A4 | A16 | A1 | A13 | A12 | A10 | DQe | DQe |
| W | DQd | DQd | TMS | TDI | A2 | A0 | A14 | TDO | TCK | DQe | DQe |

SEMICONDUCTOR MEMORY CHIP AND SEMICONDUCTOR MEMORY DEVICE USING THE SAME

BACKGROUND OF THE INVENTION

1. Field of the Invention

The present invention relates to a semiconductor memory chip and a semiconductor memory device which uses the memory chip.

2. Description of the Related Art

A memory (semiconductor memory device) having a large storage capacity represented by static RAM and dynamic RAM comprises a package, that houses a plurality of memory cells arranged in a high density on a semiconductor substrate and a control circuit that control the reading and writing of data from/to the memory cells being formed on the substrate and sealed in the package, and is mounted on a circuit board for use.

The semiconductor memory device of the prior art has terminals arranged in a pattern which is fixed for each product type. When a plurality of semiconductor memory devices are to be mounted on a circuit board to provide a large memory capacity, for example, the semiconductor memory devices are mounted on one surface of the circuit board.

However, when the semiconductor memory devices are mounted on a circuit board in such an arrangement as in the prior art, there are such problems as a large mounting area is required and the length of interconnection becomes long.

When the semiconductor memory devices are mounted on both surfaces of the circuit board, on the other hand, length of interconnection cannot be decreased enough since the terminals of the semiconductor memory device are arranged in a pattern fixed for each product type, thus resulting in such problems as the wiring pattern for the interconnection on the circuit board becomes complicated.

SUMMARY OF THE INVENTION

In view of the problems described above, an object of the present invention is to provide a semiconductor memory device that can be mounted on both sides of a circuit board having a relatively simple wiring pattern and can be manufactured at a low cost, and a semiconductor memory chip that is suitable for the constitution of the semiconductor memory device.

The semiconductor memory chip of the present invention includes a plurality of memory cells and a control circuit that controls the reading and writing of data from/to the memory cells. In the semiconductor memory, the memory cells and the control circuit are formed on a semiconductor substrate and a plurality of electrode pads are formed on one of the principal planes for the purpose of input and output of signals to/from the control circuit. The semiconductor memory chip of the present invention is characterized in that at least a pair of the electrode pads consist of selective connection electrode pads that can drive the control circuit by selecting and connecting either one thereof, and the two selective connection electrode pads are disposed on both sides of a longitudinal or lateral chip centerline on the one principal plane.

With the semiconductor memory chip having the constitution described above, since at least a pair of the electrode pads consist of the selective connection electrode pads, and the two selective connection electrode pads are disposed on both sides of a longitudinal or lateral chip centerline on the one principal plane, terminal arrangement can be changed when combined with a package or the like by selecting either one of the selective connection electrode pads, thus improving the degree of freedom in the design of the terminal arrangement. The semiconductor memory chip may be either a static RAM or a dynamic RAM.

The semiconductor memory device of the present invention includes the semiconductor memory chip and a package or a substrate. The package or the substrate has substrate pad electrodes to which the electrode pads of the semiconductor memory chip are connected and which are provided on one surface thereof. The package or the substrate has a plurality of terminals provided on the other surface, which have electrical continuity with the substrate pad electrodes. The plurality of terminals are disposed in such an arrangement as the terminals used for the input or output of signals of the same type are placed symmetrically on both sides of the longitudinal or lateral centerline on the other surface of the package or the substrate, while two selective connection terminals provided in correspondence to the pair of selective connection electrode pads are placed symmetrically on both sides of the centerline.

This constitution makes it possible to easily constitute the semiconductor memory devices for top surface mounting and bottom surface mounting simply by changing the connection between the semiconductor memory chip and the package or the substrate, using the same semiconductor memory chip and the package or the substrate described above.

In the semiconductor memory device of the present invention, the package or the substrate is preferably a ball grid array package or a ball grid array substrate.

BRIEF DESCRIPTION OF THE DRAWINGS

FIG. 4 is a plan view of terminal arrangement of the semiconductor memory device for top surface mounting according to the embodiment of the present invention.

PREFERRED EMBODIMENTS OF THE INVENTION

Now the semiconductor memory device according to a preferred embodiment of the invention will be described below with reference to the accompanying drawings.

Figure 2:
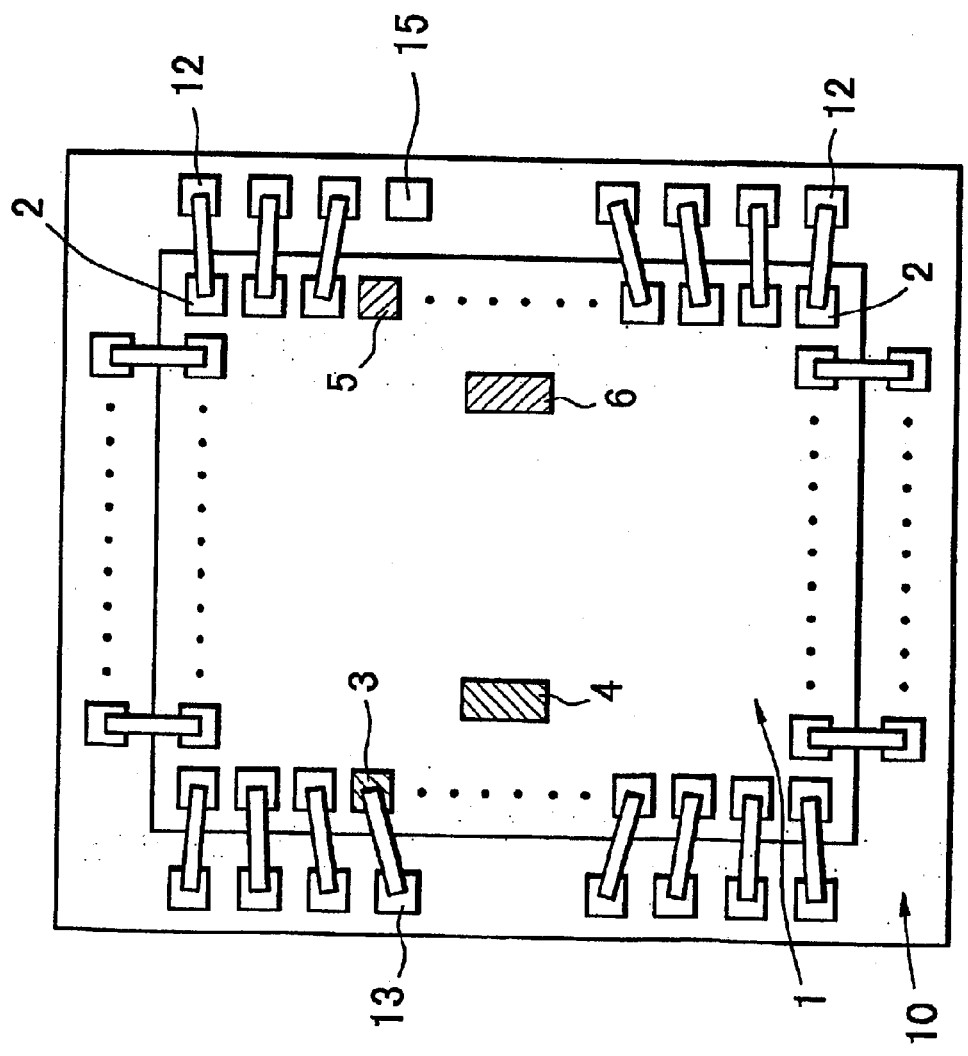
FIG. 2 is a plan view of the semiconductor memory device for top surface mounting according to the embodiment of the present invention.

The semiconductor memory device of the present invention is a static random access memory (SRAM), more specifically a 18M synchronous SRAM comprising a semiconductor memory chip (IC chip) 1 and a ball grid array substrate (BGA) 10 which has the IC chip 1 mounted on one surface thereof as shown in FIG. 2.

According to this embodiment, the IC chip 1 has such a constitution as a plurality of memory cells and a control circuit that controls the reading and writing to/from the memory cells are formed on a semiconductor substrate in a high density, and a plurality of electrode pads are formed on one surface of the semiconductor substrate for the input and output of signals.

In this specification, the term control circuit is used for broad sense covering a circuit related to the addressing and data input/output for an array of a plurality of memory cells and a circuit that controls the reading and writing from/to the memory cells, and includes an addressing circuit, a clock circuit (CLK buffer) and a data input/output circuit.

The IC chip 1 of this embodiment has such a circuit constitution as a first clock buffer circuit (first CLK buffer) 4 and a second clock buffer circuit (second CLK buffer) 6 are provided as clock circuits that generate signals for controlling the operation timing of the control circuit, and can operate as memory by supplying a control signal to only one of the clock circuits from the outside of the chip.

In the IC chip 1 of this embodiment, a first CLK pad 3 for the input of control signal to the first CLK buffer 4 from the outside of the chip and a second CLK pad 5 for the input of control signal to the second CLK buffer 6 from the outside of the chip are disposed symmetrically on both sides of the longitudinal centerline of the chip.

The first CLK pad 3 and the second CLK pad 5 are selective connection electrode pads either one of which is selected and used for the connection with the outside, while the control signal is input through the selected electrode pad.

Figure 1:
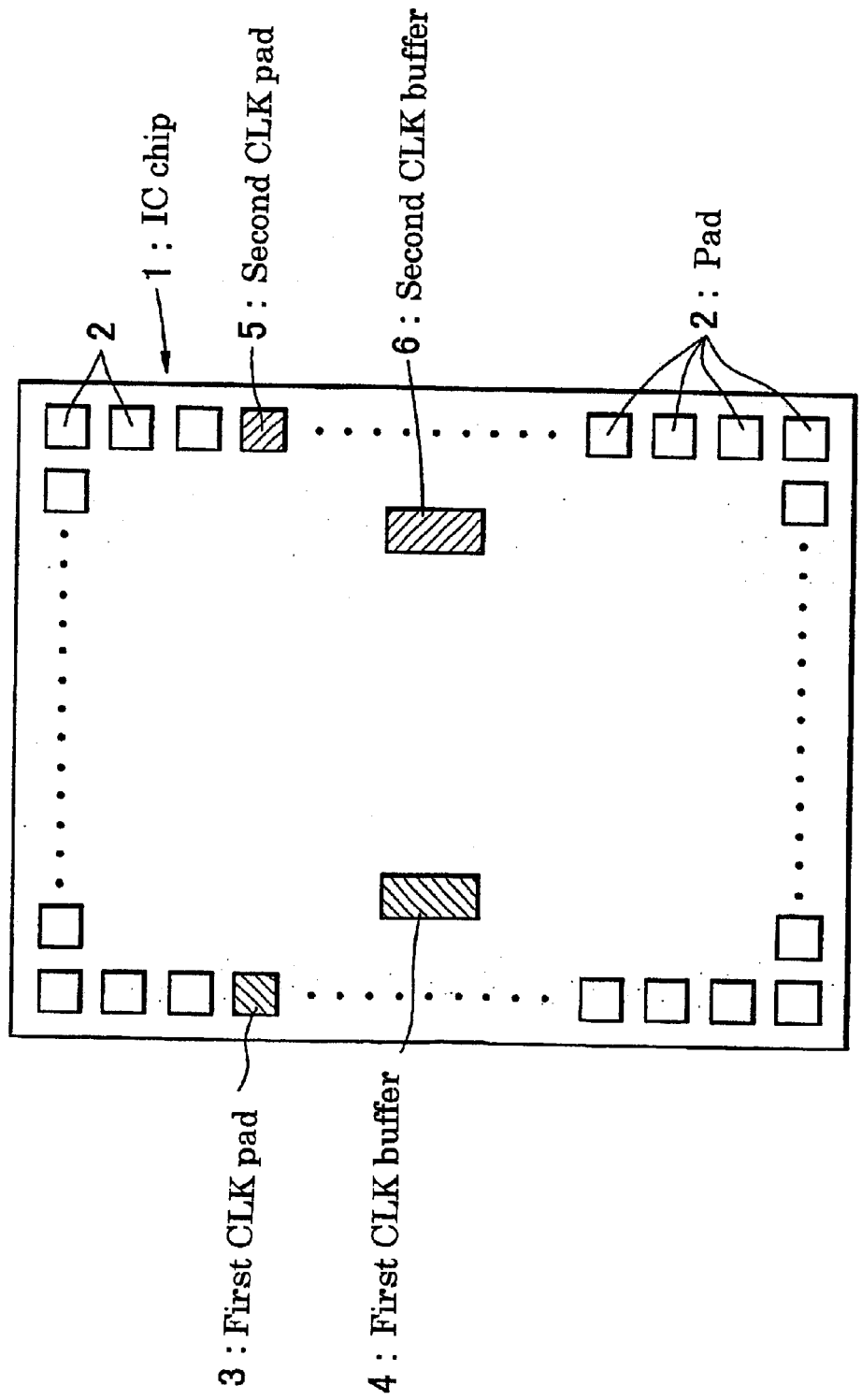
FIG. 1 is a plan view of the semiconductor memory chip according to the embodiment of the present invention.

Pad 2 of the IC chip 1 shown in FIG. 1 is an electrode pad which is used, for example, for the address input or data input/output, other than the first CLK pad 3 and the second CLK pad 5.

Electrode pad for address input that corresponds to an address terminal A17 to be described later, although not shown in the drawing, also comprises a pair of selective connection electrode pads, while either one of which is selected and used for the connection with the outside.

In this embodiment, the BGA substrate 10 is a multiple layer wiring substrate, for example, having a first substrate pad electrode 13, a second substrate pad electrode 15 and a substrate pad electrode 12 which correspond to the first CLK pad 3, the second CLK pad 5 and the pad 2 of the IC chip 1, respectively, formed on one surface thereof, while terminal electrodes connected to the first substrate pad electrode 13, the second substrate pad electrode 15 and the substrate pad electrode 12 are formed on the other surface.

On the BGA substrate 10, the terminal electrode formed on the other surface in correspondence to the first substrate pad electrode 13 and the terminal electrode formed on the other surface in correspondence to the second substrate pad electrode 15 are disposed in a symmetrical arrangement with respect to the longitudinal or lateral centerline of the substrate on the other surface (K3 and K9 in FIG. 4).

Also on the BGA substrate 10, the two terminal electrodes formed on the other surface in correspondence to the selective connection electrode pads which are formed in correspondence to one address terminal are also disposed in a symmetrical arrangement with respect to the longitudinal or lateral centerline of the substrate on the other surface (B5 and B7 in FIG. 4).

Further on the BGA substrate 10, terminals used for the input or output of signals of the same type among the terminal electrodes formed in correspondence to the substrate pad electrodes 12 are disposed in a symmetrical arrangement with respect to the centerline of the substrate.

According to this embodiment, the semiconductor memory chip (IC chip) 1 and the BGA substrate 10 having the constitution described above are used in such a connection as described below, thereby to constitute two types of semiconductor memory device, semiconductor memory device of terminal arrangement for top surface mounting (semiconductor memory device of first type) and semiconductor memory device of terminal arrangement for bottom surface mounting (semiconductor memory device of second type). (Semiconductor memory device of first type for top surface mounting)

According to this embodiment, the semiconductor memory device of first type is constituted by mounting (die bonding) the semiconductor memory chip on one surface of the BGA substrate 10 as shown in FIG. 2, and making interconnection as described below.

The pads 2 of the semiconductor memory chip 1 are wire-bonded to the corresponding substrate pad electrodes 12.

The first CLK pad 3 that is connected to the first CLK buffer 4 is wire-bonded to the corresponding first substrate pad electrode 13.

In the semiconductor memory device of first type for top surface mounting, the second CLK pad 5 that is connected to the second CLK buffer 6 is not connected to the corresponding second substrate pad electrode 15.

In the semiconductor memory device of first type for top surface mounting constituted as described above, the plurality of terminals provided on the other surface (mounting surface) of the BGA substrate 10 are disposed, for example, in such an arrangement as shown in FIG. 4.

Letters shown in FIG. 4 represent the terminals as shown in Table 1.

TABLE 1

| | |
|---|---|
| DQ | Input/output terminal |
| DQP | Parity output terminal |
| CQ, CQ# | Echo clock terminals |
| A, A0, A1 | Address terminal |
| E, E1# | Chip enable terminals |
| BW# | Byte write terminal |
| VSS | GND terminal |
| NC | Terminal left unconnected |
| VDDQ | Power output terminal |
| CLK | Clock terminal |
| T | JTAG terminal |
| VDD | Power terminal |
| ADV | Address extension terminal |
| W# | Write enable terminal |
| MCL | Low-level connection terminal |
| ZQ | Output impedance control terminal |
| EP2, EP3 | Chip enable program terminals |
| MCH | High-level connection terminal |
| LBO# | Burst mode control terminal |

In FIG. 4, the terminal indicated at row B, column 5 (hereinafter denoted as B5) and the terminal indicated at row B, column 7 (hereinafter denoted as B7) are two terminals formed in correspondence to the selective connection electrode pads that are formed for one address terminal on the IC chip 1. That is, the terminal indicated at B5 and the terminal indicated at B7 are selective connection terminals either one of which is selected and used for connection, while the terminal indicated at B7 is used as the address input terminal in the semiconductor memory device of first type for top surface mounting of this embodiment.

The terminal indicated at row K, column 3 (hereinafter denoted as K3) and the terminal indicated at row K, column 9 (hereinafter denoted as K9) are selective connection terminals formed in correspondence to the first CLK pad 3 and the second CLK pad 5 of the IC chip 1, and either one of which is used for connection, while the terminal indicated at K3 is used as the clock input terminal (CLK) in the semiconductor memory device of first type.

In this embodiment, two pairs of the selective connection terminals are disposed symmetrically with respect to the centerline of the substrate on the mounting surface of the substrate, with one of the pairs being used for the connection with the outside.

The terminals, except for the selective connection terminals (B5, B7, K3, K9) described above among the plurality of terminals that are formed on the mounting surface of the BGA substrate 10, are disposed so that the terminals used for input or output of signals of the same type are symmetrical with respect to the longitudinal centerline (column 6) of the mounting surface.

For example, the address terminals A9, A8 are provided at positions symmetrical with the address terminals A6, A7, the A11 terminal is provided at a position symmetrical with the A3 terminal, and A10, A12, A13 terminals are provided at positions symmetrical with A5, A4, A16 terminals.

Data input/output terminals DQb, DQf, DQa, DQe are provided at positions symmetrical with the data input/output terminals DQg, DQc, DQh, DQd.

According to this embodiment, as described above, a pair of selective connection terminals are disposed symmetrically with each other with respect to a line on the mounting surface, although the arrangement is asymmetrical in terms of connection since only one of the terminals is connected at a time. Other terminals are provided symmetrically in terms of both location and connection, since these are disposed at symmetrical positions on the mounting surface and actually connected. (Semiconductor memory device of second type for bottom surface mounting)

Figure 3:
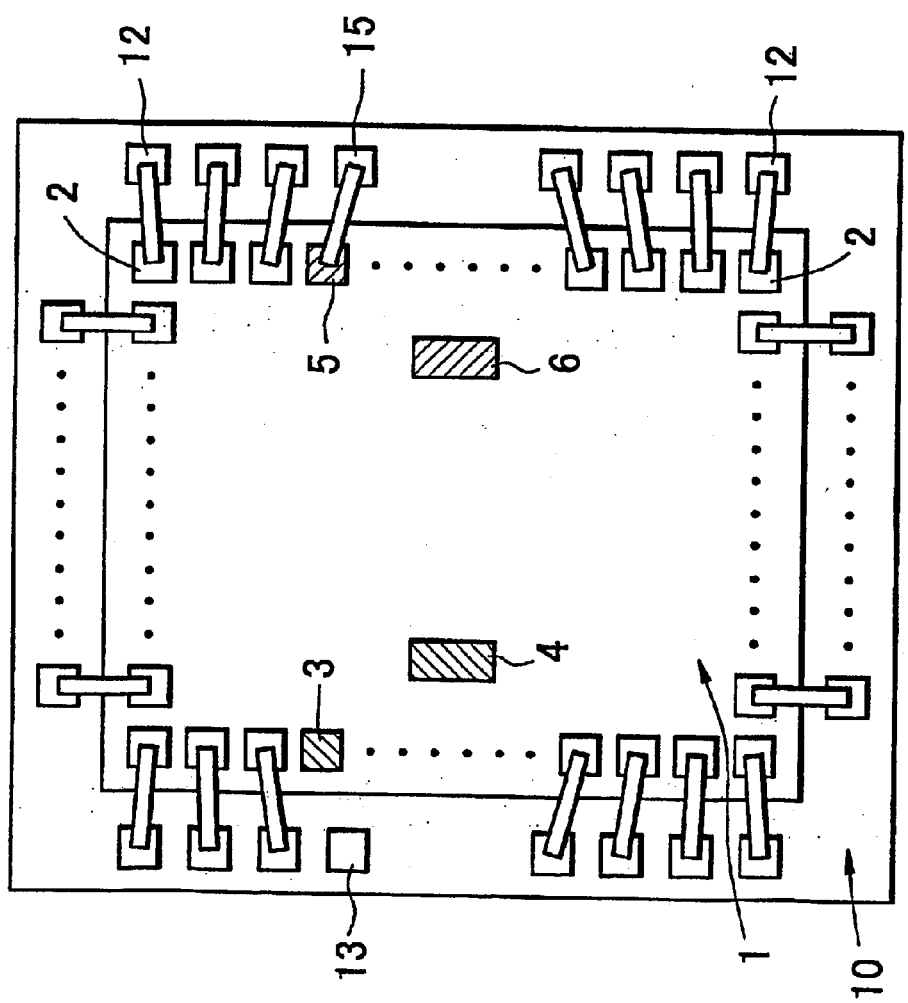
FIG. 3 is a plan view of the semiconductor memory device for bottom surface mounting according to the embodiment of the present invention.

According to this embodiment, the semiconductor memory device of second type 102 is constituted by mounting (die bonding) the semiconductor memory chip 1 on one surface of the BGA substrate 10 as shown in FIG. 3, and making interconnection as described below.

The pads 2 of the semiconductor memory chip 1 are wire-bonded to the corresponding substrate pad electrodes 12, similarly to the semiconductor memory device of first type 101 The second CLK pad 5 that is connected to the second CLK buffer 6 is wire-bonded to the corresponding second substrate pad electrode 15.

In the semiconductor memory device of second type for bottom surface mounting, the first CLK pad 5 that is connected to the first CLK buffer 4 is not connected to the corresponding first substrate pad electrode 13.

In the semiconductor memory device of second type for bottom surface mounting constituted as described above, the plurality of terminals provided on the other surface (mounting surface) of the BGA substrate 10 are disposed in such an arrangement as, when the mounting surface thereof is opposed to the mounting surface of the semiconductor memory device of first type, the same terminals oppose each other.

The above expression that the same terminals oppose each other means that the same terminals having the same symbols oppose each other such as the address terminal A0 to the address terminal A0, and data input/output terminal DQa to the data input/output terminal DQa.

Figure 5:
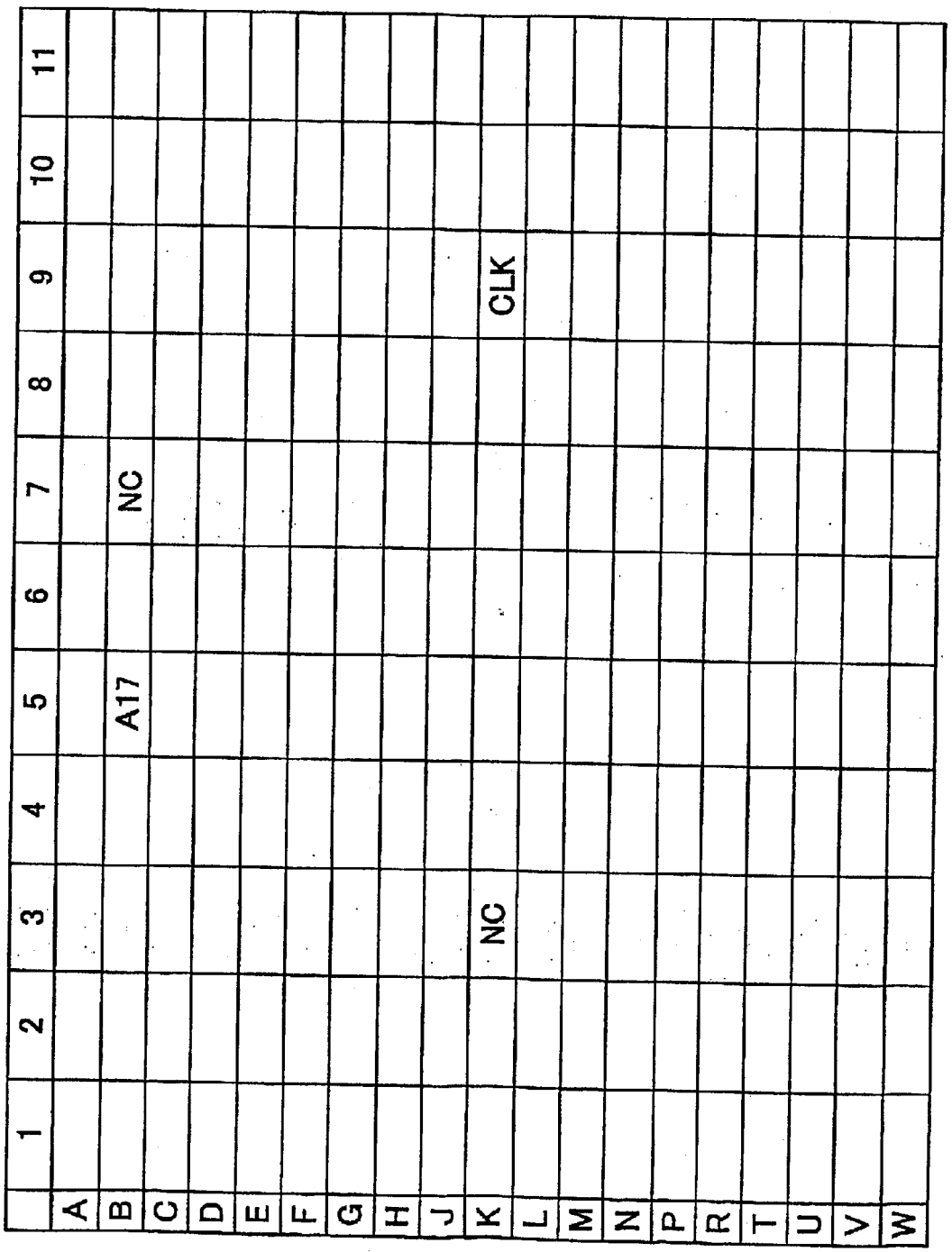
FIG. 5 is a plan view of terminal arrangement of the semiconductor memory device for bottom surface mounting according to the embodiment of the present invention.

Therefore with regard to the selective connection terminals, the address terminal A17 is located at the position of B5 and the position of B7 is occupied by the non-connected terminal NC, as shown in FIG. 5.

Also the clock terminal (CLK) is located at the position of K9 and the position of K3 is occupied by the non-connected terminal NC.

As described above, in the semiconductor memory device of second type, the terminal located at the position of B5 among the pair of selective connection terminals comprising the terminal located at the position of B5 and the terminal located at the position of B7 is used as the address input terminal, while the terminal located at the position of K9 among the pair of selective connection terminals comprising the terminal located at the position of K3 and the terminal located at the position of K9 is used as the clock input terminal (CLK).

As will be apparent from the above description, the pair of selective connection terminals are disposed symmetrically with respect to the centerline of the substrate on the mounting surface thereof, also in the semiconductor memory device of second type of this embodiment, while one of the pair is used for the connection with the outside and the terminals except for the selective connection terminals (B5, B7, K3, K9) described above among the plurality of terminals formed on the mounting surface of the BGA substrate 10 are disposed so that the terminals used for input or output of signals of the same type are symmetrical with respect to the longitudinal centerline (column 6) of the mounting surface. (Applications of semiconductor memory devices of first type and second type)

Now an example of applications of the semiconductor memory device of first type for top surface mounting and the semiconductor memory device of second type for bottom surface mounting of this embodiment will be described below.

Figure 6A:
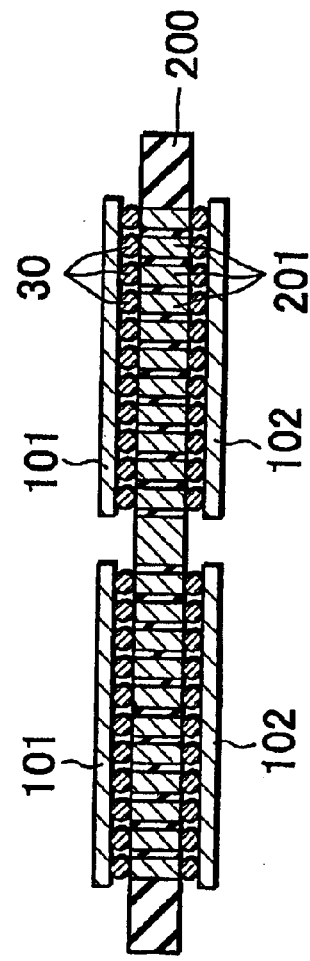
FIG. 6 shows a sectional view (FIG. 6A) and a plan view (FIG. 6B) of an application using the semiconductor memory device for top surface mounting and the semiconductor memory device for bottom surface mounting according to the embodiment of the present invention.
Figure 6B:
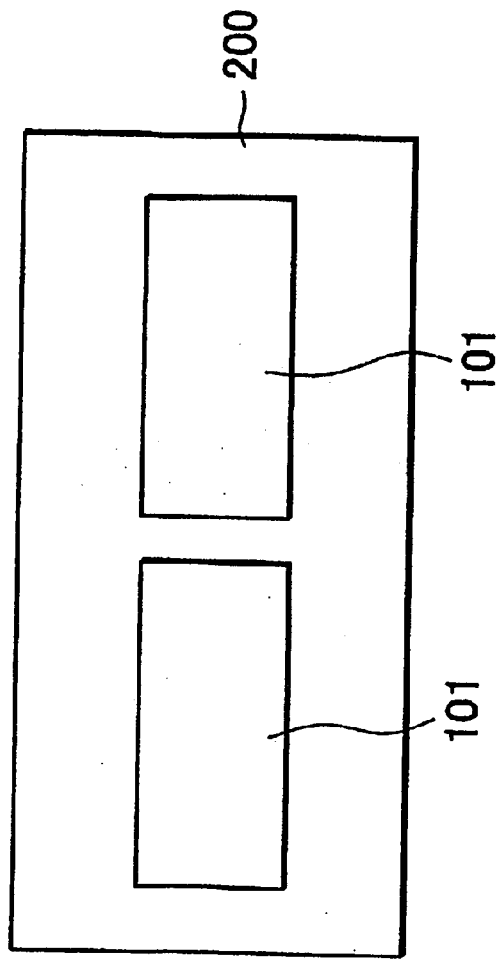

The semiconductor memory devices of first type and second type of this embodiment has such a constitution as shown in FIGS. 6A and 6B that a semiconductor memory device of first type 101 is mounted on one surface of a mounting substrate 200 and a semiconductor memory device of second type 102 is mounted on the other surface of the mounting substrate 200 so as to oppose the semiconductor memory device of first type 101.

In this case, the semiconductor memory device of second type for bottom surface mounting is provided so that the terminals thereof oppose the same terminals of the semiconductor memory device of first type which correspond thereto, while the opposing terminals are directly connected by means of electrodes 201 formed in through holes that are provided in the mounting substrate 200, except for some pair of terminals.

Terminals that are not directly connected with the electrodes 201 formed in the through holes are chip enable terminals E1#, E2, E3 and chip enable program terminals EP2, EP3, which are connected separately to an external circuit and used to control whether the semiconductor memory device of first type or the semiconductor memory device of second type is to be selected or not.

In the case of the application having the constitution described above, since the semiconductor memory devices of first type and second type can be mounted on both surfaces of the mounting substrate 200, the packaging area can be decreased to half that of the case in which a plurality of semiconductor memory devices are mounted side by side on one surface.

Also in this application, since the semiconductor memory devices of first type and second type mounted on the top surface and the bottom surface of the mounting substrate 200 can be directly connected with each other by means of the electrodes formed in the through holes, wiring length can be decreased so as to improve the system performance.

Features of the embodiment of the present invention can be summed up as follows.

(1) In the semiconductor memory chip (IC chip) 1, for example, one or more electrode pad is used as pair of selective connection electrode pad, and the two electrode pads are disposed symmetrically on both sides of centerline of the chip so as to make it possible to select the position of feeding signals, thereby improving the degree of freedom in the terminal arrangement design.

(2) In relation to (1), the IC chip 1 has such a circuit constitution as the first clock buffer circuit 4 and the second clock buffer circuit 6 are formed, while only one of which is supplied with the control signal so as to operate, with the first CLK pad 3 connected to the first CLK buffer 4 and the second CLK pad 5 connected to the second CLK buffer 6 being disposed symmetrically on both sides of one centerline of the chip, thereby making it possible to select the position where the signal is supplied for the cock circuit and improving the degree of freedom in the terminal arrangement design.

(3) By disposing the two terminals (selective connection terminals) which correspond to the selective connection electrode pads of the IC chip 1 symmetrically with respect to one centerline of the substrate on the BGA substrate 10, it is made possible to select one of the selective connection terminals which are disposed symmetrically by changing the connection.

According to this embodiment, when these features are made use of, the semiconductor memory devices for top surface mounting and bottom surface mounting (semiconductor memory devices of first type and second type) can be easily constituted simply by changing the connection with wire while using the same semiconductor memory chip 1 and the BGA substrate 10.

According to this embodiment of the present invention, as described above, since the semiconductor memory devices for top surface and bottom surface mounting can be easily manufactured by using the same IC chip 1, thus the semiconductor memory device that can be packaged in a high density can be manufactured with high productivity and low cost.

While the embodiment described above concerns the SPAM, the present invention is not limited to this and can also be applied, for example, to the dynamic random access memory (DRAM) while achieving similar effects as those of the SRAM.

While the BGA substrate is used in the embodiment described above, the present invention is not limited to this constitution and various constitutions can be employed such as BGA package and a package having pin terminals.

The semiconductor memory chip of the present invention comprises a plurality of memory cells and a control circuit wherein at least a pair of the electrode pads consist of selective connection electrode pads that can drive the control circuit by selecting and connecting either one thereof, and the two selective connection electrode pads are disposed on both sides of one centerline of the chip on one of the principal planes so that the terminal arrangement when combined with a package or the like can be changed by selecting either one of the selective connection electrode pads, thus improving the degree of freedom in the terminal arrangement design of the package or the like.

Accordingly, the semiconductor memory chip that is suitable for the constitution of the semiconductor memory device that can be mounted on both surfaces of the mounting substrate having a relatively simple wiring pattern and can be manufactured at a low cost is provided.

In the semiconductor memory chip of the present invention, such a constitution may also be employed as two clock buffer circuits, first and second, are formed for the generation of signals that control the timing of the control operation of the control circuit, while constituting the pair of selective connection electrode pads from the first CLK pad electrode connected to the first clock buffer circuit and the second CLK pad electrode connected to the second clock buffer circuit, thereby making it possible to change the clock terminal position when combined with a package or the like.

When the static RAM is employed for the semiconductor memory chip, such an SRAM memory chip suitable for SRAM memory that can be mounted on both surfaces of the mounting substrate and can be manufactured at a low cost can be provided.

When dynamic RAM is employed for the semiconductor memory chip, such a DRAM memory chip can be provided that is suitable for DRAM memory which can be mounted on both surfaces of the mounting substrate and can be manufactured at a low cost.

With the semiconductor memory chip of the present invention, terminal arrangement can be changed more efficiently by disposing the pair of selective connection electrode pads symmetrically with respect to the centerline.

The semiconductor memory device of the present invention comprises the semiconductor memory chip and a package or a substrate, that has substrate pad electrodes to which the electrode pads of the semiconductor memory chip are connected being provided on one surface thereof, and a plurality of terminals having electrical continuity with the substrate pad electrodes being provided on the other surface. The plurality of terminals are disposed in such an arrangement as the terminals used for the input or output of signals of the same type are placed symmetrically on both sides of the longitudinal or lateral centerline on the other surface of the package or the substrate, while two selective connection terminals provided in correspondence to the pair of selective connection electrode pads are placed in a symmetrical arrangement with respect to the centerline. Thus it is made possible to easily constitute the semiconductor memory devices for top surface mounting and bottom surface mounting simply by changing the connection between the semiconductor memory chip 1 and the package or the substrate, using the same semiconductor memory chip 1 and the package or the substrate described above.

According to the semiconductor memory device of the present invention, therefore, the semiconductor memory device that can be mounted on both surface of the mounting substrate having a relatively simple wiring pattern and can be manufactured at a low cost can be provided.

Also in the semiconductor memory device of the present invention, by using a ball grid array package or a ball grid array substrate for the package or the substrate, such a semiconductor memory device can be provided that can be packaged in a higher packaging density.

What is claimed is:

1. A semiconductor memory chip comprising a plurality of memory cells and a control circuit that controls the reading and writing of data from/to the memory cells being formed on a semiconductor substrate, wherein a plurality of electrode pads are formed on one of the principal planes for the purpose of input and output of signals to/from the control circuit, wherein at least a pair of the electrode pads consist of selective connection electrode pads that can drive the control circuit by selecting and connecting either one thereof, and the two selective connection electrode pads are disposed on both sides of a longitudinal or lateral chip centerline on the one principal plane.

2. The semiconductor memory chip of according to claim 1;

wherein said control circuit comprises a first and a second clock buffer circuits for generating signals that control the timing of the control, wherein said pair of selective connection electrode pads consist of a first CLK pad electrode connected to said first clock buffer circuit and a second CLK pad electrode connected to said second clock buffer circuit.

3. The semiconductor memory chip according to claim 1;

wherein said pair of selective connection electrode pads are disposed symmetrically with respect to the centerline.

4. A semiconductor memory device comprising;

a semiconductor memory chip comprising a plurality of memory cells and a control circuit that controls the reading and writing of data from/to the memory cells being formed on a semiconductor substrate, in which a plurality of electrode pads are formed on one of the principal planes for the purpose of input and output of signals to/from the control circuit, and in which at least a pair of the electrode pads consist of selective connection electrode pads that can drive the control circuit by selecting and connecting either one thereof, and the two selective connection electrode pads are disposed on both sides of a longitudinal or lateral chip centerline on the one principal plane, a package or a substrate having substrate pad electrodes on one surface thereof for connecting with said electrode pads of said semiconductor memory chip and a plurality of terminals on the other surface, said plurality of terminals being connected electrically with said substrate pad electrodes respectively, wherein said plurality of terminals are disposed so that the terminals used for the input or output of signals of the same type are placed symmetrically on both sides of the longitudinal or lateral centerline on said other surface and so that two selective connection terminals corresponding to said pair of selective connection electrode pads are placed symmetrically on both sides of said centerline.

5. The semiconductor memory device according to claim 4;

wherein said package is a ball grid array package or said substrate is a ball grid array substrate.

* * * * *